US012588467B2

(12) United States Patent
Maleev et al.

(10) Patent No.: US 12,588,467 B2
(45) Date of Patent: Mar. 24, 2026

(54) OPTICAL SENSORS FOR MEASURING PROPERTIES OF CONSUMABLE PARTS IN A SEMICONDUCTOR PLASMA PROCESSING CHAMBER

(71) Applicant: Tokyo Electron Limited, Tokyo (JP)

(72) Inventors: Ivan Maleev, Fremont, CA (US);
Shin-Yee Lu, Fremont, CA (US);
Dimitri Klyachko, Fremont, CA (US);
Ching Ling Meng, Sunnyvale, CA
(US); Xinkang Tian, Fremont, CA
(US)

(73) Assignee: Tokyo Electron Limited, Tokyo (JP)

( * ) Notice: Subject to any disclaimer, the term of this patent is extended or adjusted under 35 U.S.C. 154(b) by 734 days.

(21) Appl. No.: 17/889,114

(22) Filed: Aug. 16, 2022

(65) Prior Publication Data

US 2023/0055839 A1      Feb. 23, 2023

Related U.S. Application Data

(60) Provisional application No. 63/234,139, filed on Aug. 17, 2021.

(51) Int. Cl.
*H01L 21/68* (2006.01)
*H01J 37/32* (2006.01)
*H01L 21/677* (2006.01)

(52) U.S. Cl.
CPC ...... *H01L 21/681* (2013.01); *H01J 37/32642*
(2013.01); *H01L 21/67742* (2013.01)

(58) Field of Classification Search
None
See application file for complete search history.

(56) References Cited

U.S. PATENT DOCUMENTS 6,032,512 A * 3/2000 Li ........................... H01L 21/68
73/1.79
6,156,124 A * 12/2000 Tobin ................ H01L 21/67745
414/935

(Continued)

FOREIGN PATENT DOCUMENTS

CN        111916390 A      11/2020
JP        2001-358208 A      12/2001

(Continued)

OTHER PUBLICATIONS

International Search Report and Written Opinion issued Nov. 24, 2022 in PCT/US2022/074384, 12 pages.

(Continued)

*Primary Examiner* — Thor S Campbell
(74) *Attorney, Agent, or Firm* — Oblon, McClelland, Maier & Neustadt, L.L.P.

(57)      ABSTRACT

A method of manufacturing semiconductor devices includes repeatedly performing a transfer operation which transfers each of a plurality of semiconductor wafers between a substrate handling module and a processing chamber through a wafer access port, the processing chamber including at least one consumable component. Using the processing chamber, a semiconductor manufacturing process is performed on each of the plurality of semiconductor wafers; and detecting an optical signal from the at least one consumable component during a time when the processing chamber is not performing the semiconductor manufacturing process on the wafers.

25 Claims, 11 Drawing Sheets

(56) References Cited

U.S. PATENT DOCUMENTS

| | | | |
|---|---|---|---|
| 6,463,782 B1* | 10/2002 | Shen | H01L 21/68 |
| | | | 73/1.79 |
| 6,896,765 B2 | 5/2005 | Steger | |
| 7,176,403 B2 | 2/2007 | Steger | |
| 8,730,482 B2 | 5/2014 | Matsudo et al. | |
| 9,841,395 B2 | 12/2017 | Sugita et al. | |
| 10,014,198 B2 | 7/2018 | Richardson | |
| 10,074,549 B2 | 9/2018 | Sugita et al. | |
| 10,186,402 B2 | 1/2019 | Kamata et al. | |
| 11,437,257 B2 | 9/2022 | Moriya | |
| 2003/0139852 A1* | 7/2003 | Kataoka | H01L 21/6875 |
| | | | 700/258 |
| 2003/0202092 A1* | 10/2003 | Sadighi | B25J 9/1697 |
| | | | 348/87 |
| 2004/0018745 A1* | 1/2004 | Tashiro | H01L 21/68 |
| | | | 438/758 |
| 2004/0117055 A1 | 6/2004 | Seidel et al. | |
| 2006/0157698 A1* | 7/2006 | Miyajima | H01L 21/67288 |
| | | | 257/48 |
| 2012/0021671 A1 | 1/2012 | Mcreynolds et al. | |
| 2013/0122711 A1 | 5/2013 | Marakhtanov et al. | |
| 2015/0016936 A1* | 1/2015 | Shindo | H01L 21/67742 |
| | | | 414/749.5 |
| 2015/0214009 A1* | 7/2015 | Glukhoy | H01J 37/32091 |
| | | | 239/132.3 |
| 2016/0177449 A1* | 6/2016 | Ohmori | H01J 37/32926 |
| | | | 118/723 VE |
| 2016/0216185 A1* | 7/2016 | Gottscho | H01J 37/3299 |
| 2017/0053819 A1* | 2/2017 | Richardson | H01J 37/3244 |
| 2017/0213753 A1 | 7/2017 | Rogers | |
| 2017/0254755 A1* | 9/2017 | Cho | G01J 3/0208 |
| 2017/0263478 A1* | 9/2017 | McChesney | H01J 37/20 |
| 2017/0287682 A1 | 10/2017 | Musselman et al. | |
| 2018/0040460 A1* | 2/2018 | Gottscho | H01J 37/32935 |
| 2018/0061696 A1 | 3/2018 | D'Ambra et al. | |
| 2019/0291214 A1* | 9/2019 | Peng | H01J 37/32495 |
| 2019/0348317 A1 | 11/2019 | D'Ambra et al. | |
| 2020/0006100 A1* | 1/2020 | Clark | H01L 21/68707 |
| 2020/0357674 A1 | 11/2020 | Moriya | |
| 2020/0411390 A1 | 12/2020 | Yang et al. | |
| 2021/0005487 A1 | 1/2021 | Tsai et al. | |
| 2021/0223038 A1* | 7/2021 | Kimura | G01C 3/08 |
| 2022/0344184 A1* | 10/2022 | Sadeghi | H01L 21/67276 |
| 2023/0057763 A1* | 2/2023 | Maleev | H01L 21/68707 |

FOREIGN PATENT DOCUMENTS

| | | |
|---|---|---|
| JP | 2016-100407 A | 5/2016 |
| JP | 2017-50535 A | 3/2017 |
| JP | 2018-32857 A | 3/2018 |
| TW | 201139084 A1 | 11/2011 |
| TW | 201818446 A | 5/2018 |
| WO | WO 2012/018425 A2 | 2/2012 |

OTHER PUBLICATIONS

Korean Office Action issued Feb. 11, 2025 in Korean Patent Application No. 10-2024-7007638 (with English translation), 25 pages.

Combined Taiwanese Office Action and Search Report issued Dec. 13, 2024 in Taiwanese Patent Application No. 111130528 (with English translation), 21 pages.

Japanese Office Action issued May 27, 2025 in Japanese Patent Application No. 2024-508373 (with English translation), 18 pages.

Search Report and Written Opinion issued Dec. 23, 2025 in Singapore Patent Application No. 11202400896X, citing Doc. No. 1, 8 pages.

* cited by examiner

1100

1200

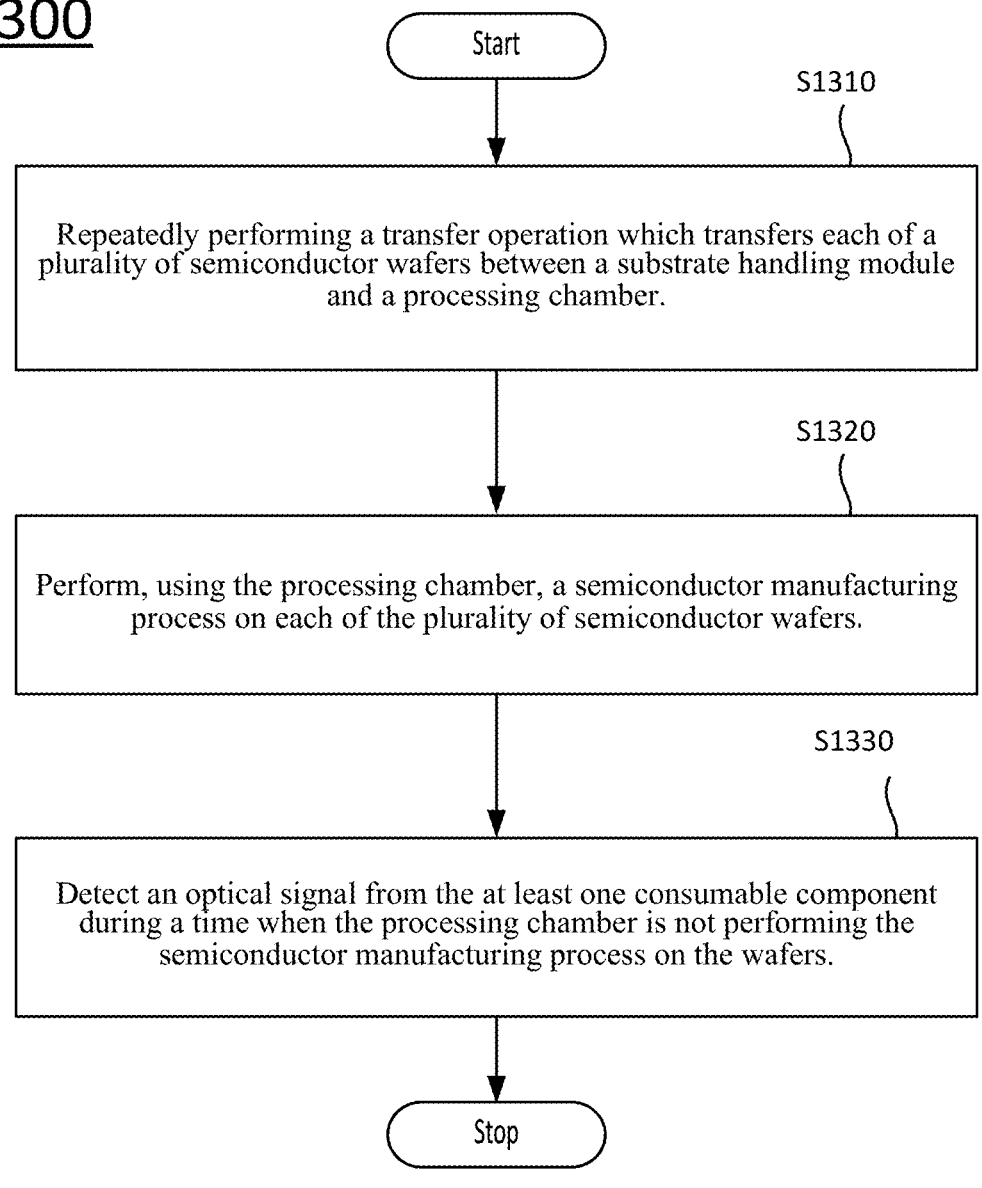

<u>1300</u>

Start

S1310

Repeatedly performing a transfer operation which transfers each of a plurality of semiconductor wafers between a substrate handling module and a processing chamber.

S1320

Perform, using the processing chamber, a semiconductor manufacturing process on each of the plurality of semiconductor wafers.

S1330

Detect an optical signal from the at least one consumable component during a time when the processing chamber is not performing the semiconductor manufacturing process on the wafers.

Stop

FIG. 13

OPTICAL SENSORS FOR MEASURING PROPERTIES OF CONSUMABLE PARTS IN A SEMICONDUCTOR PLASMA PROCESSING CHAMBER

INCORPORATION BY REFERENCE

This present disclosure claims the benefit of U.S. Provisional Application No. 63/234,139, titled OPTICAL SENSORS FOR MEASURING PROPERTIES OF CONSUMABLE PARTS IN A SEMICONDUCTOR PLASMA PROCESSING CHAMBER filed on Aug. 17, 2021, which is incorporated herein by reference in its entirety.

TECHNICAL FIELD

The present disclosure generally relates to semiconductor processing, and more specifically relates to measurement of consumable parts in a semiconductor processing chamber using optical sensors.

BACKGROUND

Semiconductor processing chambers include various "consumable components" that gradually change in properties due to repeated exposure to processing environments during wafer processing. Such changes in the consumable components can also affect the performance of the processing chamber in that process results can shift over time. Accordingly, semiconductor device manufacturers generally monitor a condition of consumable components to ensure that a state of the components does not deteriorate the chamber performance. Monitoring techniques often use detectors or sensors that are themselves exposed to harsh environments of the processing chamber thereby affecting reliability of measurements or requiring expensive devices that can withstand the conditions of a semiconductor processing environment. Other monitoring techniques may require interruption of the semiconductor process to determine a condition of the consumable component or to perform maintenance to ensure reliability of the monitoring system itself. It is desired to have a relatively low-cost and robust system and method for accurately monitoring a state of consumable components of a processing chamber with minimal impact on throughput of the processing chamber. For example, etching is a critical step in a semiconductor manufacturing process.

SUMMARY

Aspects of the present disclosure provide a system and method for optical diagnostics of consumable parts. Aspect 1 is directed to a method of manufacturing semiconductor devices, including: repeatedly performing a transfer operation which transfers each of a plurality of semiconductor wafers between a substrate handling module and a processing chamber through a wafer access port, the processing chamber including at least one consumable component; performing, using the processing chamber, a semiconductor manufacturing process on each of the plurality of semiconductor wafers; and detecting an optical signal from the at least one consumable component during a time when the processing chamber is not performing the semiconductor manufacturing process on the wafers.

Aspect 2 includes the method of aspect 1, further including determining at least one property of the at least one consumable component from the optical signal.

Aspect 3 includes the method of aspect 1, wherein the detecting an optical signal includes detecting an optical signal from at least one of a focus ring, a gas injection showerplate, an electrode, a deposition shield, a processing chamber wall, a pumping baffle, a wafer chuck, and a wafer chuck shoulder.

Aspect 4 includes the method of aspect 1, wherein the detecting an optical signal includes detecting the optical signal from outside the process chamber through the wafer access port when the wafer access port is open for wafer transfer.

Aspect 5 includes the method of aspect 4, wherein the detecting an optical signal further includes: providing an optical sensor on an inside wall of the wafer handling module in a location with visibility to the at least one consumable component, via the wafer access port, when the wafer access port is open for wafer transfer; and using the optical sensor to detect the optical signal.

Aspect 6 includes the method of aspect 4, wherein the detecting an optical signal further includes: providing an optical sensor on a wafer handling arm of the wafer transfer robot in a location with visibility to the at least one consumable component during wafer transfer; and using the optical sensor to detect the optical signal.

Aspect 7 includes the method of aspect 6, wherein the providing an optical sensor includes providing the optical sensor on an end effector or a wafer platen of the wafer handling arm.

Aspect 8 includes the method of aspect 1, wherein the detecting an optical signal includes using a camera for acquiring images of the at least one consumable component.

Aspect 9 includes the method of aspect 8, wherein the detecting an optical signal further includes using a structured illuminator to illuminate the at least one consumable component during acquiring images of the at least one consumable component.

Aspect 10 includes the method of aspect 9, wherein the using a structured illuminator includes projecting an illumination pattern onto the at least one consumable component by sending an illumination beam at an angle to line-of-view of the camera.

Aspect 11 includes the method of aspect 10, further including determining at least one property of the at least one consumable component from acquired images of the illumination pattern projected upon the at least one consumable component, wherein the at least one property of the at least one consumable component includes at least one dimension of the three-dimensional shape of the at least one consumable component.

Aspect 12 includes the method of aspect 11, wherein the at least one consumable component is a focus ring, the method further including determining at least one of a thickness of the focus ring and a dimension of the edge profile of the focus ring.

Aspect 13 includes the method of aspect 12, wherein the at least one consumable component includes an array of gas injection holes, the method further including determining at least one of a gas injection hole diameter and a dimension of a profile of the gas injection hole chamfer.

Aspect 14 includes the method of aspect 10, wherein the illumination pattern includes a pattern of dots projected upon the at least one consumable component.

Aspect 15 includes the method of aspect 10, wherein the illumination pattern includes at least one line projected upon the at least one consumable component.

Aspect 16 includes the method of aspect 10, further including illuminating the at least one consumable component with diffuse light during acquiring images of the at least one consumable component.

Aspect 17 includes the method of aspect 10, wherein the detecting an optical signal includes detecting the optical signal only during the time when the processing chamber is not performing the semiconductor manufacturing process on the wafers.

Aspect 18 includes the method of aspect 17, wherein the detecting an optical signal includes detecting the optical signal only when the wafer access port is open.

Aspect 19 includes the method of aspect 1, further including modifying the semiconductor manufacturing process based on the detected optical signal.

Aspect 20 includes the method of aspect 19, wherein the modifying the semiconductor manufacturing process includes modifying at least one process parameter to compensate for a wear state of the consumable component.

Aspect 21 includes the method of aspect 20, wherein the modifying at least one process parameter includes modifying the process parameter to improve uniform process results across the wafer.

Aspect 22 includes the method of aspect 1, further including modifying the semiconductor chamber based on the detected optical signal.

Aspect 23 includes the method of aspect 22, wherein the modifying the semiconductor chamber includes adjusting a height of a focus ring based on the detected optical signal.

Aspect 24 includes the method of aspect 22, wherein the modifying the semiconductor chamber includes replacing at least one of the consumable components based on the detected optical signal.

Another aspect 25 of the disclosure provides a method of detecting a state of a consumable component in a semiconductor processing chamber. The method includes directing a diffuse light source and a structured light source to provide diffuse light and structured light incident on the consumable component. At least one diffuse light image of the consumable component is acquired and at least one structured light image of the consumable component is acquired. The at least one diffuse light image is used to detect edges of the consumable component, and the at least one structured light image is used to identify intersecting points where the structured light intersects the edges detected from the diffuse light image. Coordinates of the intersecting points within the semiconductor processing chamber are determined, and a 3D profile of the consumable component is constructed based on the coordinates of the intersection points.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIG. 13 shows a flowchart outlining a process according to an example embodiment of the disclosure.

DETAILED DESCRIPTION OF EMBODIMENTS

Figures 1, 2:
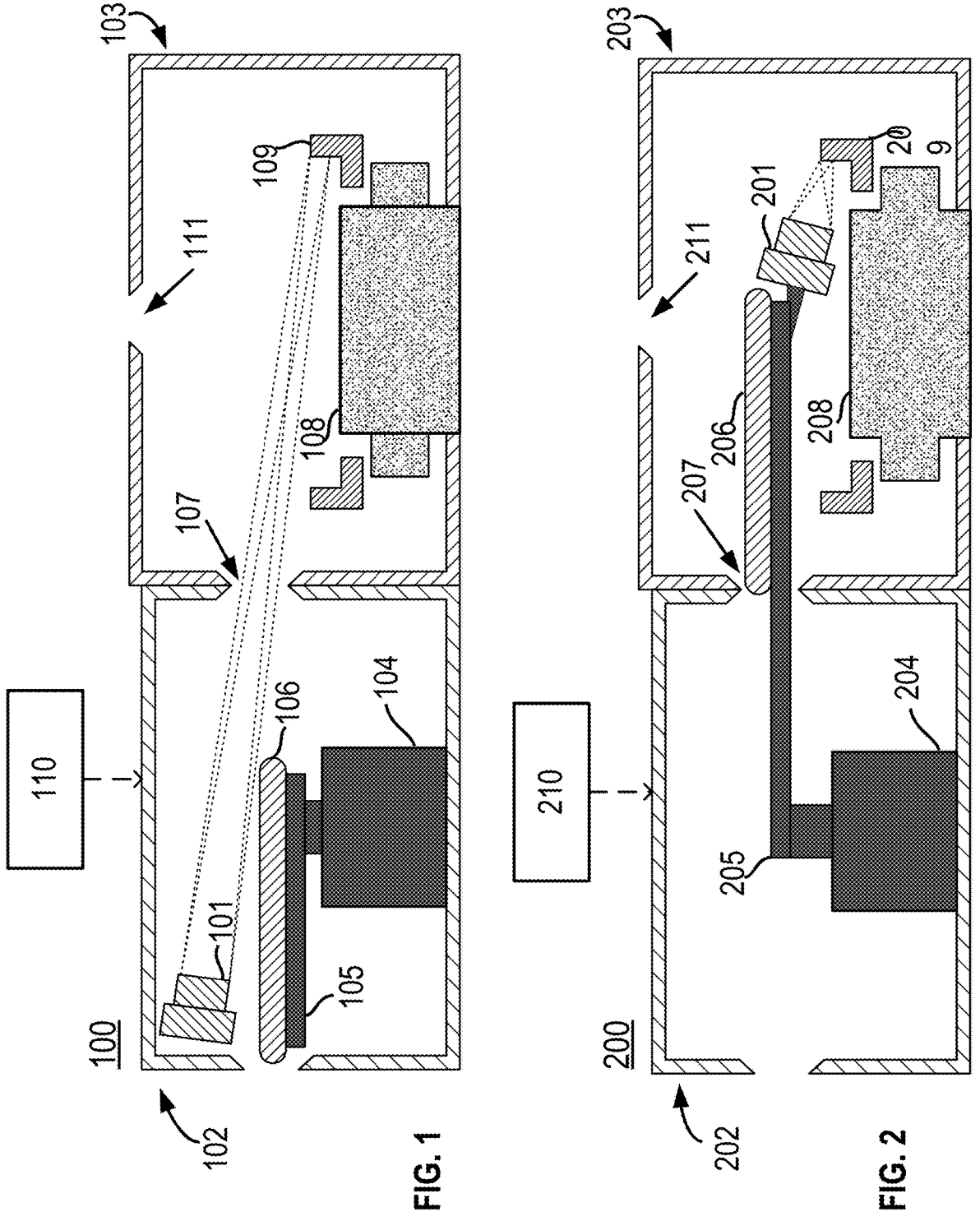
FIG. 1 shows an exemplary semiconductor processing system including a measurement setup according to an embodiment of the disclosure.
FIG. 2 shows another exemplary semiconductor processing system including a measurement setup according to another embodiment of the disclosure.

As noted in the Background, it is desired to have a relatively low-cost and robust system and method for accurately monitoring a state of consumable components of a processing chamber with minimal impact on throughput of the processing chamber. For example, etching is a critical step in a semiconductor manufacturing process. One issue faced by etch tool manufacturers is a gradual change in properties of etching chamber components such as the focus ring (FR), which surrounds a wafer during etching and helps improve plasma uniformity at edges of the wafer. However, exposure to the chamber environment may change physical properties of the FR over time and deteriorate etching performance parameters such as etching rate uniformity. For example, a physical thickness of the FR can slowly change due to exposure to the plasma and reactive chemistry. In order to maintain a desired chamber performance, a position of the FR may be periodically adjusted, and eventually the FR may need to be replaced. Accordingly, a sensor capable of tracking the changes of the physical properties of the FR and providing a feedback to a compensation mechanism is highly desirable.

Other chamber components that may benefit from a monitoring of an erosion or other dimensional changes due to effects of the plasma and aggressive chemistries include gas injection holes on a gas injection showerplate or an electrode, a wafer chuck/support, chamber walls, deposition shields, baffles, and the like. Specifically, slowly etching a gas injection hole over time can cause an increase in diameter of the gas injection hole and creation of chamfers, with negative effects on the gas injection distribution and process uniformity.

It is expected that an etching chamber operates 24 hours a day, 7 days a week under vacuum with corrosive gases inside and under high temperature, especially during an active etching. Therefore, challenges to be met are the ability for the sensors to be used without interrupting substrate processing and without a need for frequent breaking of vacuum and opening the process chamber for maintenance, etc., along with the sensors being reliable in operation in the vacuum, corrosive and high-temperature environment.

Physical properties of consumable components in a processing chamber can be monitored by an optical sensor. Given accurate information about the physical properties of the consumable components, a chamber manufacture or user can adjust the consumable components or make a decision to replace the consumable components. Alternatively, a process performed in the chamber may be modified to compensate for effects of the change in physical properties of the consumable component.

In some related arts, the optical sensor can have an optical access to an interior of the processing chamber via a use of windows mounted in chamber ports of the processing chamber. The present inventors have recognized that such windows can be susceptible to contamination and erosion, just like consumable components in the processing chamber, causing measurement drift or deterioration of measurement accuracy over time. Thus, frequent recalibration of the system and frequent window cleaning and/or replacement are needed, the latter of which requires a tool to be put out of production and opened for maintenance.

The present disclosure presents methods and apparatuses for measuring properties of consumable parts in a semiconductor processing chamber. One aspect of the disclosure includes a sensor for measuring a thickness and an edge profile of a focus ring. Embodiments can include mounting an optical sensor in various locations, such as (a) outside a plasma processing chamber with access to the focus ring provided through a wafer loading port, or other port or window of the plasma processing chamber, as shown in FIG. 1, (b) mounting the optical sensor on a wafer transfer robot for making measurements during wafer exchange, as shown in FIG. 2, and (c) mounting the optical sensor on a specially-designed wafer which includes the sensor, a power source, and storage devices for storing measurements, and which is placed into the plasma processing chamber in place of a production wafer to monitor conditions (e.g., a diameter, an erosion of chamfer, and the like) of the focus ring.

One aspect of the disclosure includes the use of a diffuse illuminator and/or structured illuminator, coupled with the optical sensor, to illuminate the focus ring. The structured illuminator can project a structured illumination with a pattern of dots or lines on the focus ring, allowing a determination of a three-dimensional (3D) shape of the focus ring. For example, dimensions of interest such as the thickness of the focus ring, which indicates an erosion level of the focus ring, can be selected and determined. A similar technique employed in conjunction with an optical sensor and optionally an illuminator, all mounted on the wafer transfer robot, can be used to diagnose the conditions of gas injection holes in a gas injection showerplate or an electrode, particularly when the gas injection showerplate or the electrode is placed in parallel to the wafer.

While the sensors described herein can be used for application in plasma etch processing chambers, and specifically for diagnosing the focus ring and gas injection holes, the sensors can be used in other plasma processing chambers, such as a plasma deposition chamber. The sensors can also be used in non-plasma semiconductor processing chambers, such as a processing chamber in which chamber parts undergo dimensional or other changes due to erosion, aggressive chemistry, mechanical wear, and the like, and monitoring of dimensional changes and conditions of the chamber parts are required.

FIG. 1 shows an exemplary semiconductor processing system having a measurement setup according to an embodiment of disclosure. In the system 100, the measurement setup includes a camera sensor (or other optical sensor) 101 mounted on a wall of a wafer transfer module 102 which is outside a processing chamber 103 (e.g., an etching chamber). The wafer transfer module 102 includes a wafer transfer robot 104 which has a wafer handling arm 105. The wafer handling arm 105 can load a wafer 106 and transfer the wafer 106 through a wafer access port 107 of the processing system to a wafer stage 108 in the processing chamber 103. The wafer 106 can be unloaded on the wafer stage 108 and surrounded by a focus ring (FR) 109 resting on the wafer stage 108. The FR 109 can facilitate uniform processing of the wafer 106, particularly at the wafer periphery. A gas injection showerplate 111 is schematically depicted.

According to aspects of the disclosure, the semiconductor processing system 100 includes a controller 110 that can be coupled to and control any or all of the components depicted in FIG. 1 during the integrated substrate processing and/or substrate metrology. Alternatively, or in addition, the controller 110 can be coupled to one or more additional controllers/computers (not shown), and the controller 110 can obtain setup and/or configuration information from an additional controller/computer. The controller 110 can be used to configure any or all of the elements of the system of FIG. 1, and the controller 110 can collect, provide, process, store, and display data from any or all of the tool components. The controller 110 can comprise a number of applications for controlling any or all of the tool components. For example, controller 110 can include a graphic user interface (GUI) component that can provide easy to use interfaces that enable a user to monitor and/or control one or more tool components.

The controller 110 can include a microprocessor, memory, and a digital I/O port capable of generating control voltages sufficient to communicate, activate inputs, and exchange information with the semiconductor processing system 100 as well as monitor outputs from the semiconductor processing system 100. For example, a program stored in the memory may be utilized to activate the inputs of the wafer transfer module 102 and/or processing chamber 103 according to a process recipe in order to perform integrated substrate processing. The controller 110 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 110 may be locally located relative to the substrate processing system 100, or it may be remotely located relative to the substrate processing system 100. For example, the controller 110 may exchange data with the substrate processing system 100 using at least one of a direct connection, an intranet, the Internet and a wireless connection. The controller 110 may be coupled to an intranet at, for example, a customer site (i.e., a device maker, etc.), or it may be coupled to an intranet at, for example, a vendor site (i.e., an equipment manufacturer). Additionally, for example, the controller 110 may be coupled to the Internet. Furthermore, another computer (i.e., controller, server, etc.) may access, for example, the controller 110 to exchange data via at least one of a direct connection, an intranet, and the Internet. As also would be appreciated by those skilled in the art, the controller 110 may exchange data with the semiconductor processing system 100 via a wireless connection.

According to aspects of the disclosure, the camera sensor 101 can be used to measure properties of consumable parts in the processing chamber 103. In the example of FIG. 1, the consumable part is the FR 109. Properties of the FR 109 can be measured or sensed through the wafer access port 107 of the processing chamber 103 while the processing chamber 103 is open and a wafer is not present in the processing chamber 103. In some embodiments, properties of the FR 109 may be measured while a wafer is present on the stage but allows an unobstructed view of at least a portion of the FR 109.

In an embodiment, the camera sensor 101 can be stationary and placed at a certain distance (e.g., 400 to 800 mm) from the FR 109. A resolution of the camera sensor 101 is limited by a numerical aperture (NA), which is defined by a height of an opening of the wafer access port 107, and a distance from the wafer access port 107 to the FR 109 (e.g., around 400 mm). Assuming the height of the opening of the wafer access port 107 is 20 mm, the maximum NA of the camera sensor 101 is around 0.025, and the maximum resolution of the camera sensor 101 with for example a 400 nm light source wavelength is (wavelength/NA)=(0.4/0.025) =16 µm, which is generally acceptable for monitoring a condition of the FR. In some embodiments, a lesser accuracy of 20 µm or even 50 µm can be used for purposes of focus ring condition monitoring.

Accuracy of measurements can be improved by analyzing a relative shift of a feature of the FR 109 in the field of view of the camera sensor 101. For example, the camera sensor 101 may only have a resolution of 20 µm, and a sharp boundary of the FR 109 can be seen as a blob of 20 um wide. However, a shift of the blob in the field of view (FOV) of the camera sensor 101 may be detectable with a resolution less than 20 um by using image processing and peak finding algorithms known in the art. In addition, the camera sensor 101 can take one or more images every time the wafer access port 107 is opened. Statistical averaging of multiple images can improve accuracy of measurements.

One benefit of the measurement setup 100 in FIG. 1 is that there is little or no impact on throughput of an etching tool because optical images may be obtained only at times between etch processing of wafers. Another potential benefit is that the camera sensor 101 may remain operational with reliable accuracy for long periods since the camera sensor 101 is placed outside the harsh chamber environment.

FIG. 2 shows another exemplary semiconductor processing system 200 including a measurement setup according to another embodiment of the disclosure. In the system 200, the measurement setup includes a camera sensor 201 (or other optical sensor) mounted on a movable wafer handling arm

205 of a wafer transfer robot 204. The wafer transfer robot 204 is located in a wafer transfer module 202 and can control the wafer handling arm 205 to load a wafer 206 and transfer the wafer 206 through a wafer access port 207 of a processing chamber 203 to a wafer stage 208 in the processing chamber 203. The wafer 206 can be unloaded on the wafer stage 208 and surrounded by an FR 209 resting on the wafer stage 208. A gas injection showerplate 211 is schematically depicted. According to aspects of the disclosure, the semiconductor processing system 200 can include a controller 210 that can be coupled to and control any or all of the tool components depicted in FIG. 2 during the integrated substrate processing and substrate metrology. The controller 210 may be implemented as the controller 110 described in FIG. 1.

In an embodiment, the camera sensor 201 can be mounted on an end effector of the wafer handling arm 205, so that the camera sensor 201 can be in close proximity to the FR 209 during an image acquisition of the FR 209, which can improve resolution of the optical sensor to less than 15 µm. For example, the static resolution of the sensor 201 can be about 2 µm. The measurement setup in FIG. 2 can also have little impact on a throughput of an etching tool because the measurements can be made only during wafer transfers. In addition, the camera sensor 201 is not exposed to a harsh chamber environment during the plasma processing.

In an embodiment, a camera sensor (e.g., the camera sensor 101 or 201) can be mounted on a sensor wafer, which can be made thicker to accommodate the camera sensor. In an embodiment, multiple camera sensors along with a power source and a storage memory can be mounted on the sensor wafer for measuring data. Such a measurement wafer can still be utilized with a standard wafer carrier such as a front opening unified pod (FOUP) and handled by a standard wafer transfer robot system (e.g., the wafer transfer robot 104 or 204). Images can be acquired of structures in a processing chamber (e.g., the processing chamber 103 or 203) which are in the field of view of the camera sensor, including a focus ring (e.g., the FR 109 or 209), gas injection holes on a gas injection showerplate (e.g., the gas injection showerplate 111 or 211), and the like. In some embodiments, images can be taken during a period on an order of one second, and the image data can be downloaded for analysis when the sensor wafer is removed from the processing chamber. Under this setup, etch tool modifications are not needed and the sensor wafer can be used across various and/or different processing tools and chambers.

According to aspects of the disclosure, an electromagnetic sensor such as a capacitive sensor can be mounted into consumable components of a processing chamber to measure physical properties of the consumable components. In an example embodiment, a ring electrode can be placed underneath or near an FR. The ring electrode can form a part of an LC or an RC circuit. An alternating current with a frequency up to radio frequency (RF) can be applied to the ring electrode, which acts as an antenna and is sensitive to the electric susceptibility of nearby materials. In particular, the circuit can be highly sensitive to geometry of a nearby dielectric and can measure for example a height of an FR after an appropriate calibration. In another example embodiment, a capacitive sensor can perform measurements while wafers are being replaced. Thus, the measurement time may be less than 1 second. The capacitive sensor can be deactivated during etching, and can also be used to fine tune plasma distribution near an FR. Benefits of using capacitive sensor include but are not limited to: (1) no impact on etching wafer throughput; (2) no interference with etching operations; (3) fine tuning of the plasma uniformity at the edge of the FR.

According to aspects of the disclosure, a wafer-sized probe with a built-in miniature camera, a power supply, and a memory storage device can be used for monitoring properties of the consumable components. In some embodiments, the probe can be slightly taller than a regular wafer. The probe should fit into a regular FOUP and can be handled and transported by regular wafer-handling tools and methods. The probe can be equipped with single or multiple built-in cameras, which face an FR and/or any other objects of interest inside the processing chamber. In an embodiment, the probe can be loaded into the processing chamber as a regular wafer. The probe can be placed on a chuck (e.g., the wafer stage 108 or 208) or can only be moved into the processing chamber by a wafer handler in order to save time. The probe can take single or multiple images of the FR and any other objects of interest inside the chamber. The images can be stored in either the built-in memory storage device or a memory card installed into the probe. A period of taking images can be for example less than 1 second. After the images are collected, the probe can be removed from the processing chamber, and the collected images can be off-loaded and analyzed. Benefits of using the probe for the measurements include but are not limited to: (i) no modifications to the processing chamber; and (ii) single probe can be used to test multiple processing chambers and consumable components.

According to aspects of the disclosure, a structured illumination can be used together with a camera sensor or other optical sensor, such as any of the camera sensors discussed herein, during an image acquisition of a structure in a processing chamber. The structured illumination can provide depth sensing information of the structure so that three dimensional (3D) information of the structure can be obtained. In some embodiments, the structured illuminator may be a laser diode based (LD-based) or an LED-based line illuminator with multiple incoherent illumination points placed over multiple locations, or extended source to minimize spatial coherence and thereby reduce speckle (i.e., grainy images) and improve sensitivity.

Figure 3:
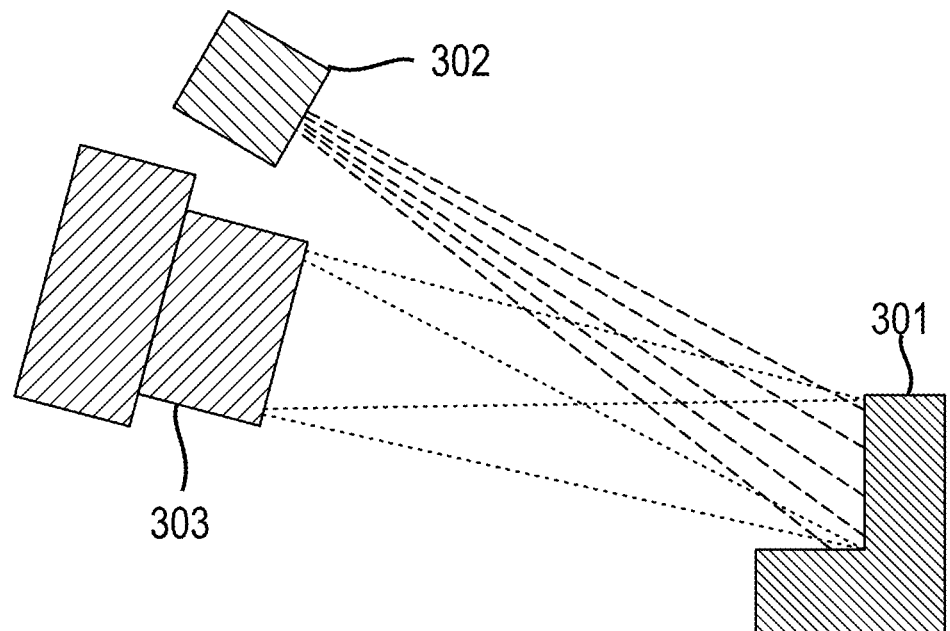
FIG. 3 shows an example of a multi-point structured illumination for recovery of a 3D structure of an object of interest according to an example embodiment of the disclosure.

FIG. 3 shows an example of a multi-point structured illumination for recovery of a 3D structure of an object of interest according to an embodiment of the disclosure. In FIG. 3, the object of interest is an FR 301. A structured illuminator 302 can be mounted near a camera sensor 303 to illuminate the FR 301, with an array of dots, for example. By measuring distances between images of the different dots on the camera sensor 303, information about the distance from the structured illuminator 302 to parts of the object illuminated by the dots can be derived. In some embodiments, one or multiple illuminated lines can be used instead of a pattern of dots for the structured illuminator 302. Other illumination patterns may also be used.

Figure 4:
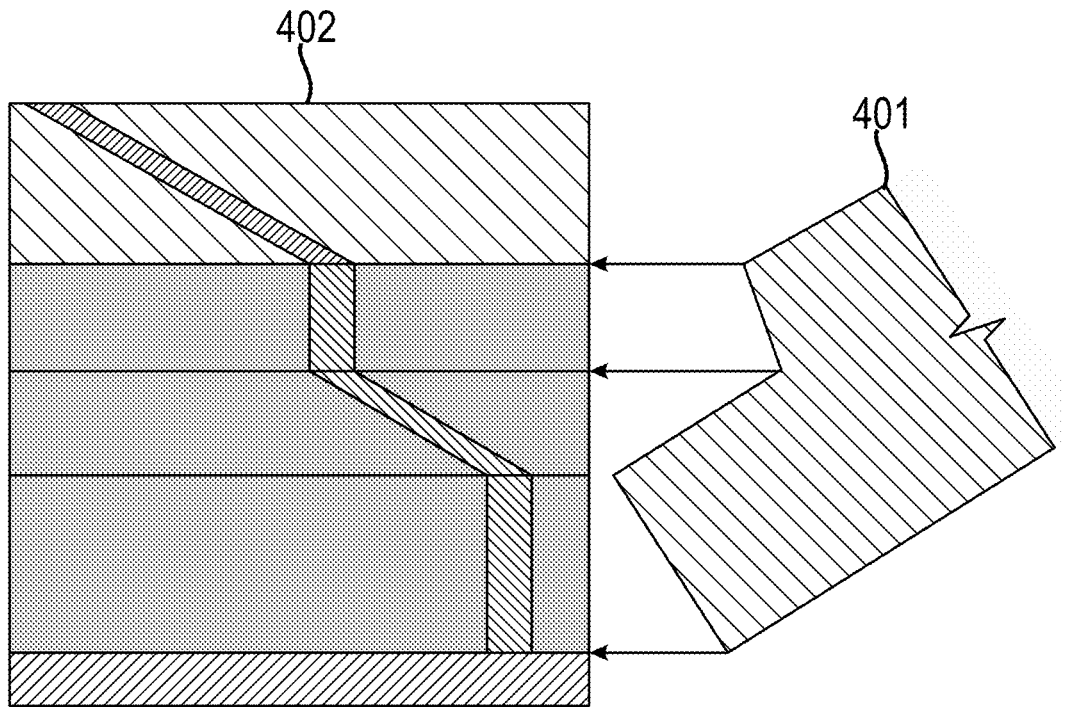
FIG. 4 shows a simulated image of a line pattern projected using a structured illuminator on an edge of a focus ring (FR) according to an example embodiment of the disclosure.

FIG. 4 shows a simulated image of a line pattern 402 projected using a structured illuminator (e.g., the structured illuminator 302) on an edge of an FR (e.g., the FR 301) according to an embodiment of the disclosure. The line pattern 402 is captured as a target in the field of view of a camera sensor (e.g., the camera sensor 303). In the example shown, the line pattern 402 represents features of a cross section 401 of the FR as shown by the arrows, which will be described in more detail below.

Figure 5A:
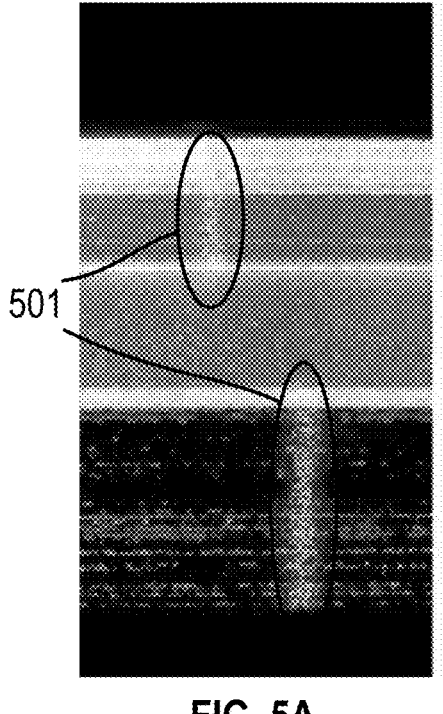
FIGS. 5A-5D show example measurement images of an edge of an FR according to an embodiment of the disclosure.
Figure 5B:
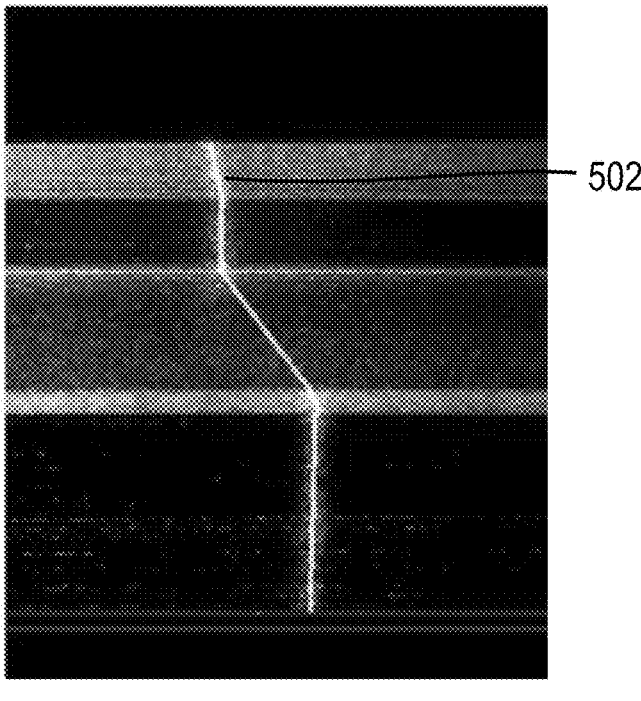

FIGS. 5A and 5B show measurement images of an edge of an FR obtained by an optical sensor according to an example embodiment of the disclosure. FIG. 5A shows an acquired raw image of the FR edge. The brighter vertical pattern of dots in the acquired raw image show a line pattern 501 projected using an off-axis structured illuminator (e.g., the structured illuminator 302) on the edge of the FR (e.g., the FR 301). Because the off-axis structured illuminator sends an illumination beam at an angle to camera line-of-view, horizontal positions of portions of line pattern allow one with knowledge in the art to determine a distance from the sensor to the corresponding sample portions. FIG. 5B shows a fitted line 502 that is fitted to the line pattern 501 by software. The fitted line 502 can be used to recover depth information and ring dimensions of the FR, including thicknesses, chamfers, step width(s), and the like.

Figure 5C:
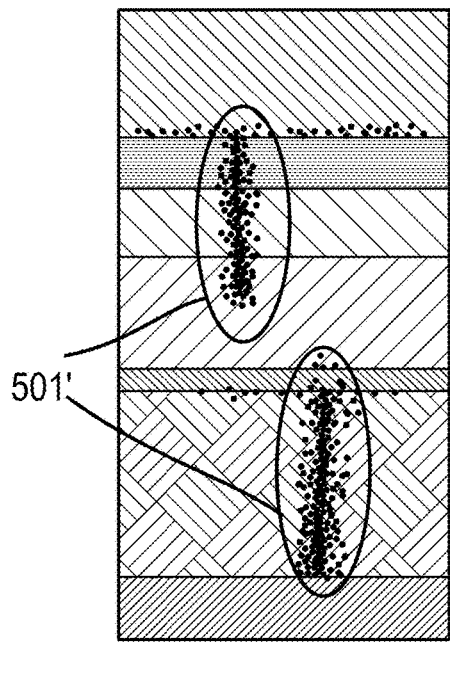
Figure 5D:
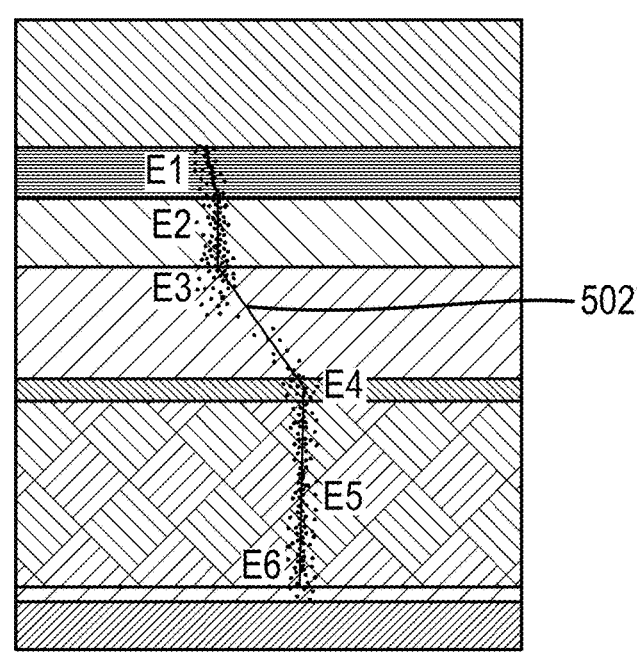

FIGS. 5C and 5D show illustrations of the measurement images of FIGS. 5A and 5B to more clearly represent line pattern 501' and fitted line 502' that can be obtained by embodiments of the present invention. As seen, the fitted line 502' includes five regions defined by points E1-E6 representing surface edges of the FR profile. For example, a segment between E1 and E2 represents an upper chamfer which joins the top surface and the upper sidewall of the FR. A segment between E2 and E3 represents the upper sidewall of the FR which extends down to the lip or shoulder top surface, and a segment E3-E4 represents a concave portion where the upper sidewall of the FR meets the lip top surface. E4-E5 represents a chamfer of the lip top surface, while E5-E6 represents a lip sidewall and E6 starts a chamfer at the bottom of the FR. As can be appreciated, height and depth measurements can be calculated based on the fitted line 502' to determine properties of the FR geometry. For example, in some aspects of the invention, software collects raw camera images and reconstructs a profile of the FR from the segmented line pattern (such as 501) and calculates a height of the upper wall or "top height" of the FR from E1. The top height of the FR directly correlates to the height of the FR when a shoulder or lip surface of the FR is covered by the wafer and protected during processing. For example, a new FR may have a total height of 4.02 mm and a lip top surface height (or "shoulder height") of 2.57 mm for a top height of 1.45 mm. A used or "old" FR may have a total height of 3.43 mm and a lip top surface height of 2.42 mm for a top height of 1.01 mm. In some embodiments, the lip top surface height was measured from E4 with a static precision of about 2 μm. It is noted that the described method depends on at least some scattering from a sample. Since a perfectly reflective surface would not scatter light, in order to address the limitation, the illuminator can be positioned in a way that only the light directly reflected from the illuminator can reach the sensor. However, since normally all surfaces are at least weakly scattering surfaces, one may also overcome the issue by increasing intensity of the illumination and/or detector sensitivity and integration time.

Figure 6:
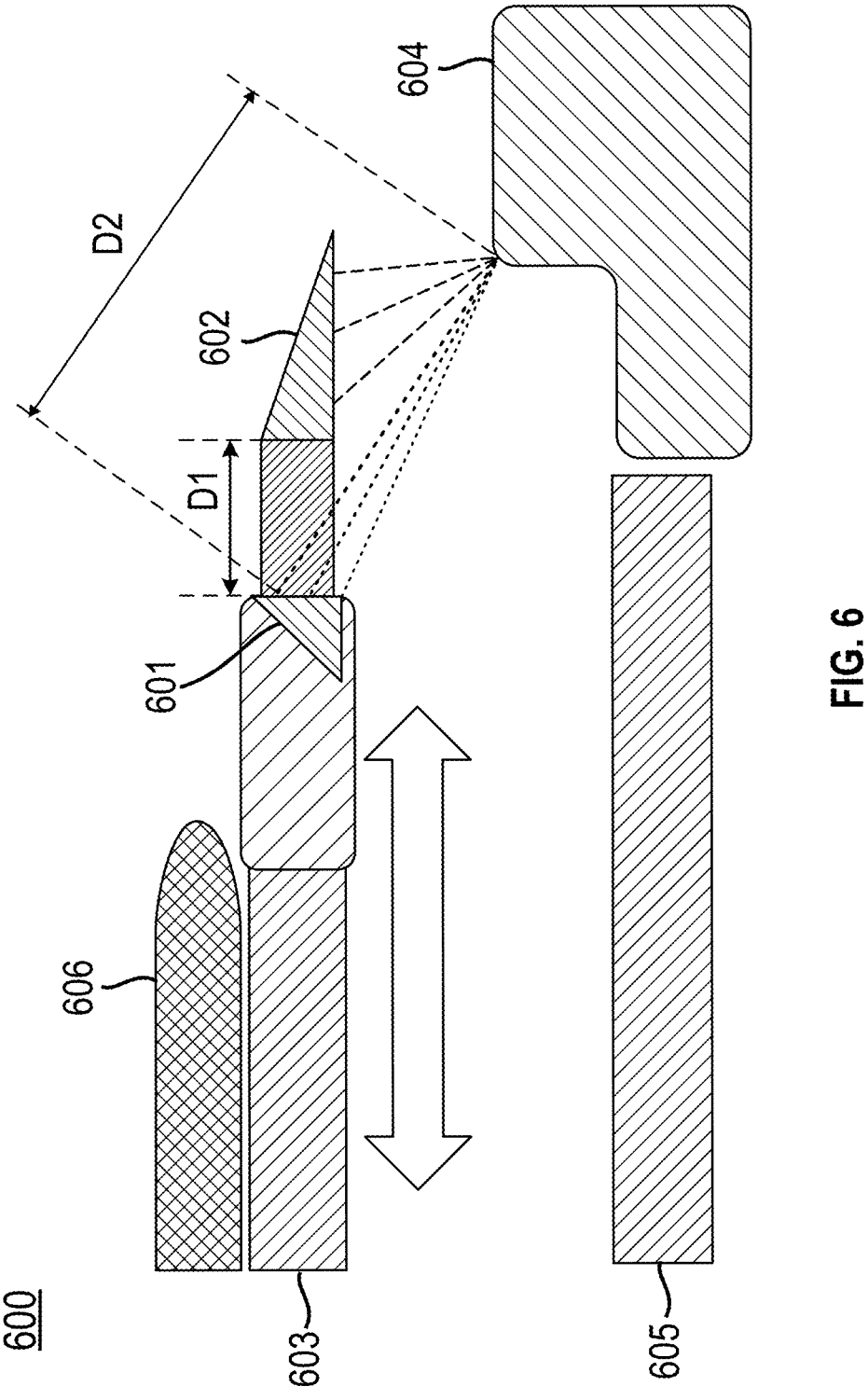
FIG. 6 shows a schematic of a measurement setup according to an example embodiment of the disclosure.

FIG. 6 shows a schematic of a measurement system 600 according to an embodiment of the disclosure. In the measurement system 600, a camera sensor 601 and a structured illuminator 602 are mounted on a wafer handling arm 603 which can move as shown by the arrows. Both the camera sensor 601 and the structured illuminator 602 face an FR 604 which is positioned at a periphery of the electrostatic chuck 605. The camera sensor 601 and the structured illuminator 602 are separated by a first distance D1, which typically can be in 5 to 50 mm range. The camera sensor 602 and the FR 604 are separated by a second distance D2. In an example, D2 can be 20 mm, but typically D2 can be in the range from 10 to 50 mm. Smaller distances present geometric constraints, and larger distances reduce optical resolution. While the sensor components are fixed to the wafer handling arm 603 in FIG. 6, the sensor components may be independently movable in some embodiments.

Figure 7:
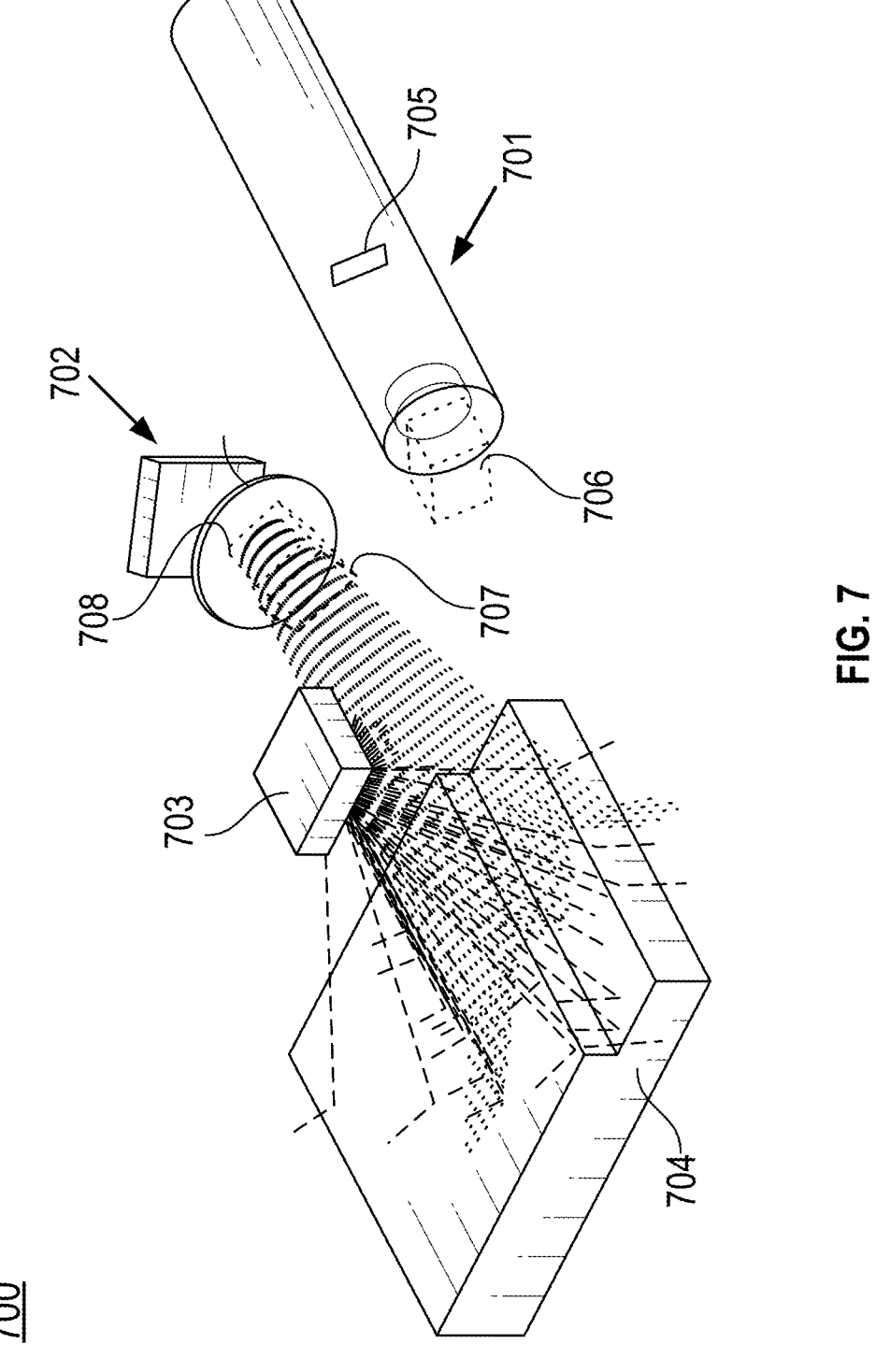
FIG. 7 shows an optical model of an example measurement setup according to an embodiment of the disclosure.
Figure 8:
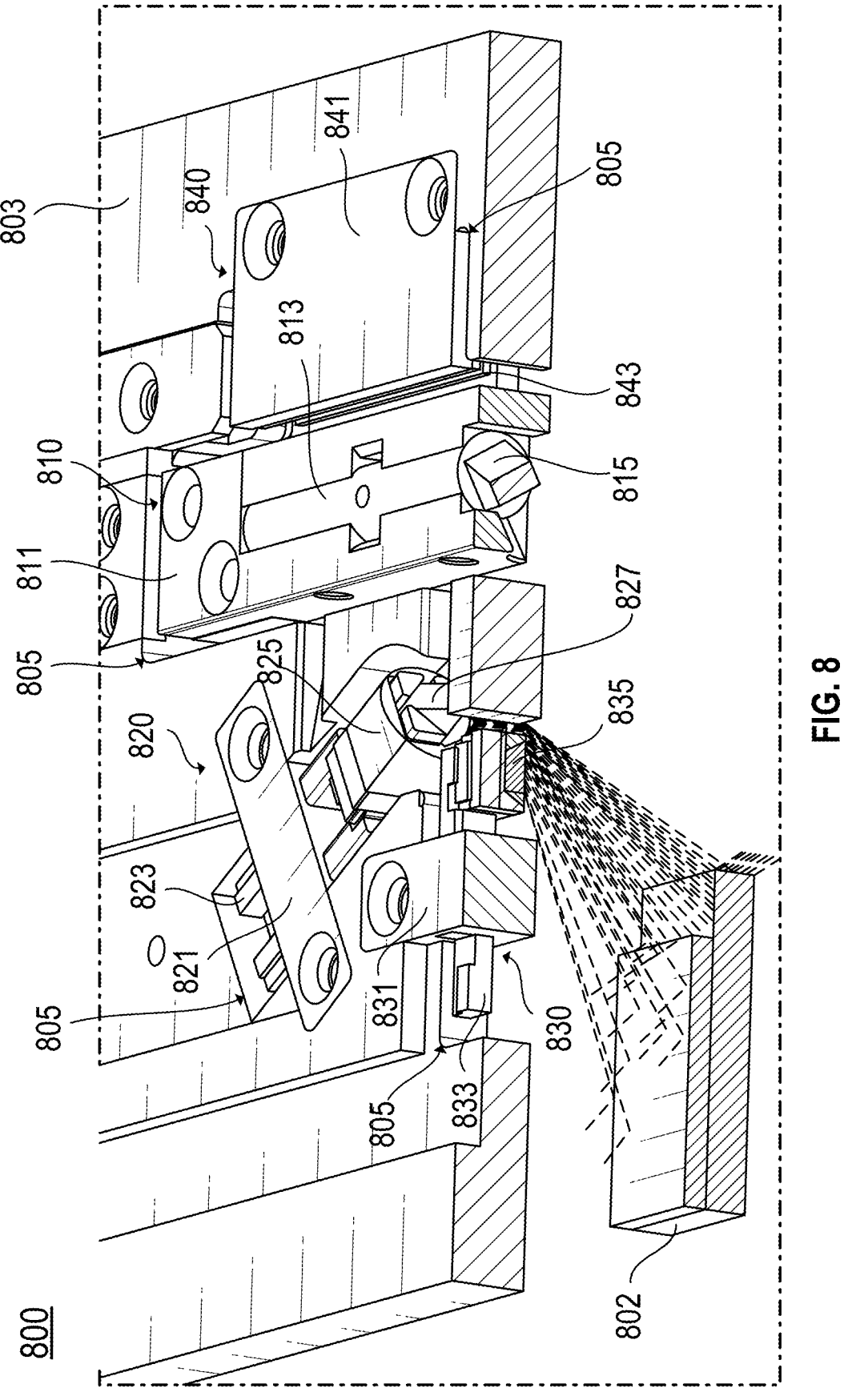
FIG. 8 shows a close up view of a mechanical model of a measurement setup according to an example embodiment of the disclosure.

FIG. 7 shows an optical model of a measurement system 700 according to another embodiment of the disclosure. In the measurement system 700, a camera sensor 701, a line structured illuminator 702, and a diffuse illuminator 703 are configured to be packaged into a wafer handling arm (not shown in FIG. 7) and to face FR 704. The structured illuminator 702 and a diffuse illuminator 703 are configured to illuminate the FR. The camera sensor 701 includes an imaging sensor 705 such as a charge coupled detector (CCD) which acquires images of the FR 704 via the camera prism 706. In some embodiments, a prism of the line illuminator 703 provides an optical angle of incidence (AOI) of about 45 degrees, while the camera prism 706 has an AOI of 60 degrees FIG. 8 shows a close up view of a mechanical model of a measurement setup 800 according to an embodiment of the disclosure. In the measurement setup 800, camera assembly 810, line illuminator assembly 820, diffuse illuminator assembly 830 and thermoelectric cooler assembly 840 are integrated into a wafer handling arm 803 such as a fork. As seen, camera assembly 810, line illuminator assembly 820, diffuse illuminator assembly 830 and thermoelectric cooler assembly 840 are provided within respective openings 805 of the wafer handling arm 803 and arranged to obtain optical signals from focus ring 802. It is noted that only a small sector of the FR edge is shown in FIG. 8

Camera assembly 810 includes a camera fixture 811 for joining camera 813 and lens 815 as an assembly and coupling the assembly to the wafer handling arm 803. Line illuminator assembly 820 includes line illuminator fixture 821 for joining light source portion 823, lens holder 825 and lens 827 as an assembly and coupling the assembly to the wafer handling arm 803. Diffuse illuminator assembly 830 includes diffuse illuminator fixture 831 for joining light source portion 833 and lens 835 as an assembly and coupling the assembly to the wafer handling arm 803. Thermoelectric cooler assembly 840 includes a cover 841 provided over thermoelectric cooler 843 which is positioned in the wafer handling arm 803 to cool one or more of the camera assembly 810, line illuminator assembly 820 and diffuse illuminator assembly 830. Each of the fixtures 811, 821 and 831, and the cover 841 include fastener holes to permit fastening of the respective assemblies to the wafer handling arm 803. While the example of FIG. 8 shows the camera assembly 810, line illuminator assembly 820, diffuse illuminator assembly 830 and thermoelectric cooler assembly 840 individually coupled to the wafer handling arm 803, these elements may be assembled as a unit which is integrated with the wafer handling arm 803.

Figure 9A:
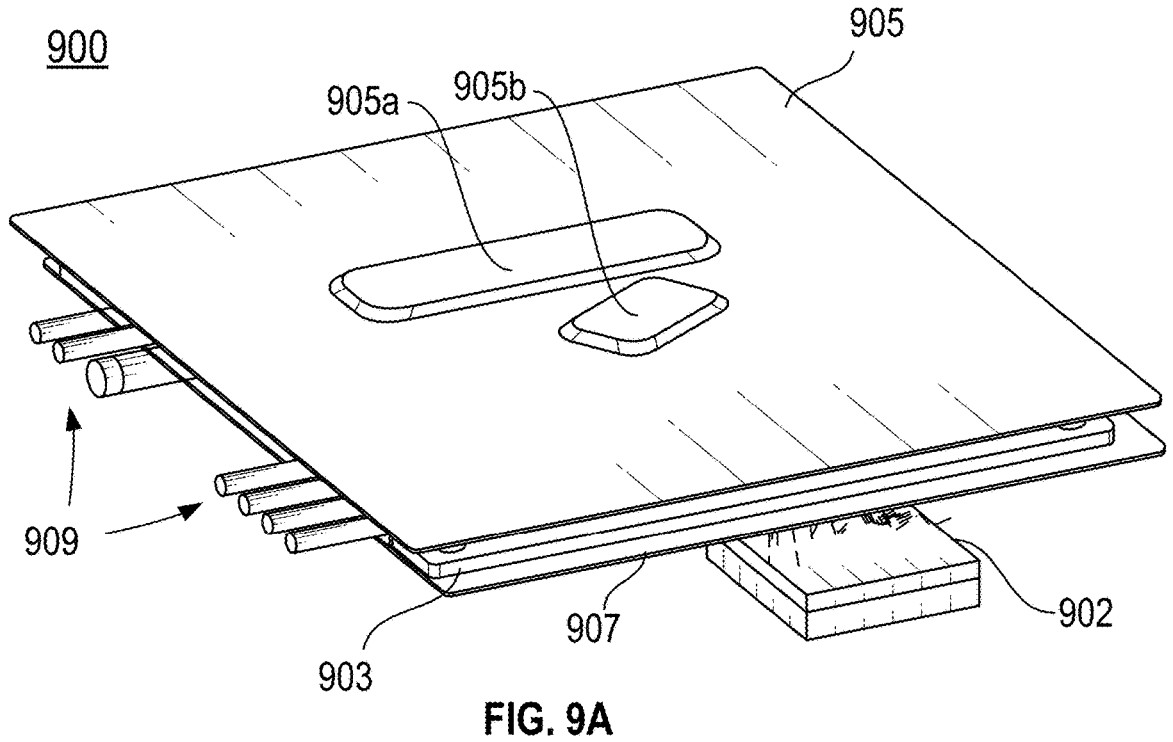
FIGS. 9A and 9B show a close up view of a mechanical model of an example measurement setup according to an embodiment of the disclosure.
Figure 9B:
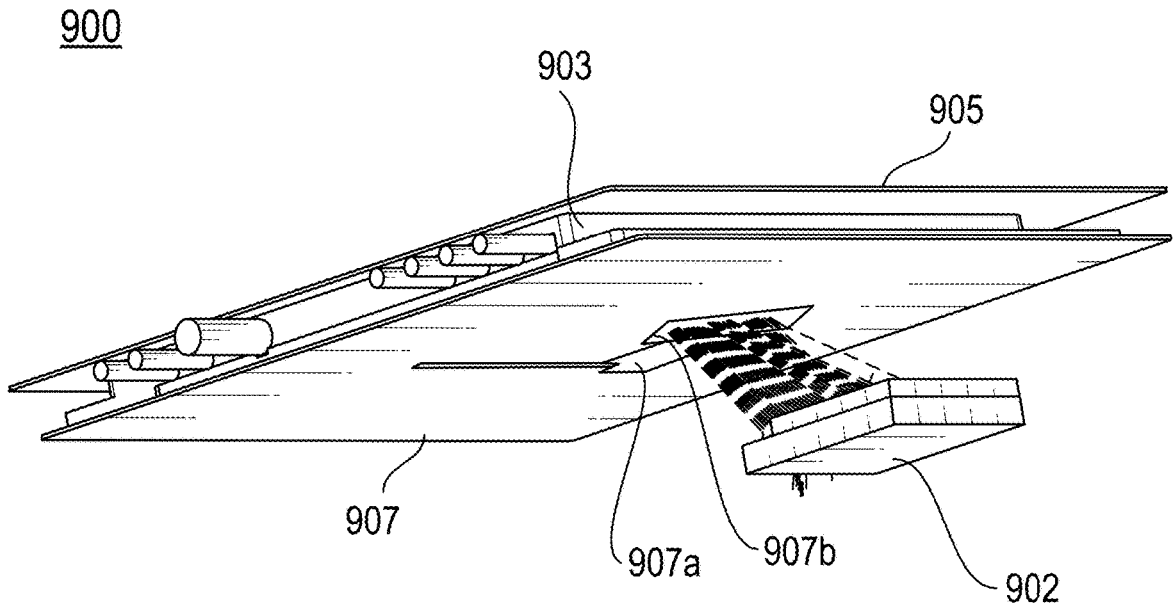

FIGS. 9A and 9B show a close up view of a mechanical model of a measurement setup 900 according to another embodiment of the disclosure. In the measurement setup 900, the camera assembly, line illuminator assembly, diffuse illuminator and thermoelectric cooler assembly are integrated with a portion of a wafer handling arm 903 as described with respect to FIG. 8. Power and signal wires 909 may be integrated with the wafer handling arm for power and signal routing to the camera and lighting elements of the measurement setup. In the embodiment of FIGS. 9A and 9B, the sensor elements provided within an enclosure formed by plates 905 and 907. FIG. 9A and FIG. 9B show a top view and a bottom view of the mechanical model of the measurement setup 900, respectively. Top plate 905 includes enclosure spaces 905a for containing the camera assembly (hidden), and enclosure space 905b for enclosing the line illuminator and/or diffuse illuminator (hidden). Bottom plate 907 includes window 907a for the covering the camera assembly, and window 907b for covering the line illuminator and/or diffuse illuminator. The enclosure of the camera system 901 is on a top surface of the wafer handling arm and the windows of the camera system 901 is on a bottom surface of the wafer handling arm and face an FR 902. The windows 907a and 907b permit optical visibility to the FR 902 and are preferably transparent.

According to aspects of the disclosure, in addition to the structured illumination, other methods can be employed to obtain 3D/depth information of the object of interest during an image acquisition of the object. These methods include but are not limited to (i) moving a robot arm-mounted camera sensor (e.g., the camera sensor 201) to multiple positions and analyzing images of the object of interest obtained from these positions; and (ii) having two camera sensors for stereoscopic images, including two camera sensors mounted on a wafer handling arm, and collecting images simultaneously, wherein each camera sensor can be optimized based on a working distance of the respective camera sensor. Placing the camera sensor(s) on a wafer handling arm may lead to space constraints. To address space constraints, the camera sensor(s) can be mounted remotely, with the images transmitted to the camera sensor(s) via for example fiber bundle(s) from collection lenses and/or optics mounted within the wafer handling arm.

In an embodiment, the camera sensor can be a 3D camera sensor, for example, based on a time delay technique.

According to aspects of the disclosure, in addition to determining conditions of an FR, the camera sensors, measurement setups, and measurement methods presented in this disclosure can be used to collect information about other consumable components of a processing chamber, such as gas injection holes on a showerplate or an electrode, chamber walls, deposition shields, wafer chuck shoulder coating, a gas exhaust baffle plate, and the like.

Figures 10A, 10B:
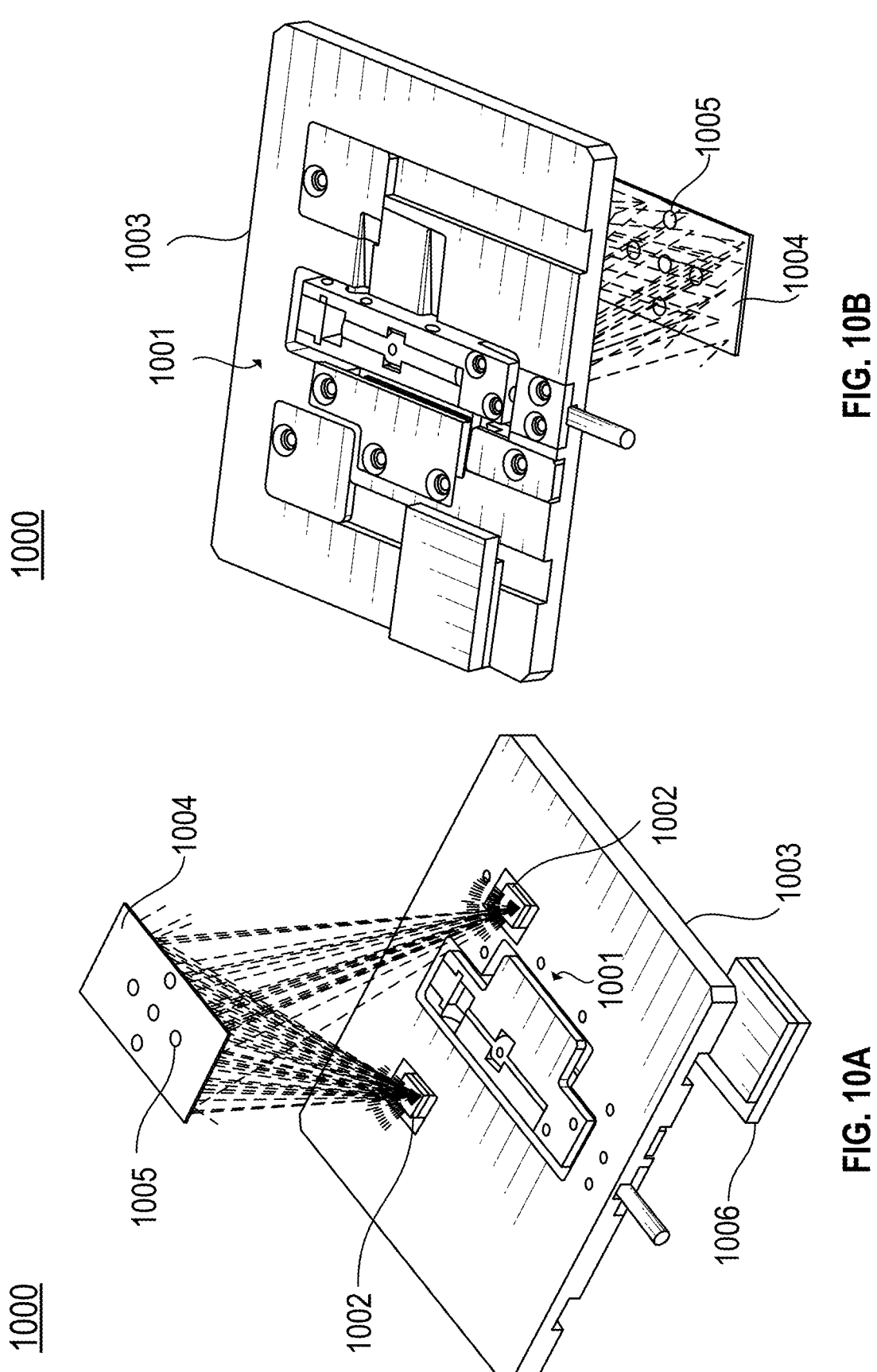
FIGS. 10A and 10B show a close up view of a mechanical model of a measurement setup according to an example embodiment of the disclosure.

FIGS. 10A and 10B show a close up view of a mechanical model of a measurement setup 1000 according to an embodiment of the disclosure. In the measurement setup 1000, a camera sensor 1001 and illuminators 1002 are mounted on a wafer handling arm 1003. The camera sensor 1001 is used to acquire images of an array of gas injection holes of a gas injection showerplate 1004 (or an electrode) which is located above the wafer handling arm 1003 and in a processing chamber. FIGS. 10A and 10B show a top view and a bottom view of the mechanical model of the measurement setup 1000, respectively. In the example embodiment, the illuminators 1002 may be diffuse and or structured illuminators which illuminate the array of gas injection holes of the gas injection showerplate 1004, and the camera sensor 1001 images the illuminated array of gas injection holes. For example, images of a gas injection hole 1005 can be acquired by the camera sensor 1001, and properties such as physical dimensions of the gas injection hole 1005 can be obtained through the acquired images. It is noted that although only five gas injection holes are shown in FIG. 10A, the number of the gas injection holes of the gas injection showerplate 1004 is not limited in this disclosure. Further, a structured illuminator 1002 may be provided to enable complex 3D measurements of the gas injection holes 1005. However, the structured illuminator may be omitted where only simple measurements are sought from planar images, such as a diameter of the gas injection holes 1005.

According to aspects of the disclosure, camera sensors for diagnosing the conditions of an FR and an array of gas injection holes can be embedded in an end effector of a wafer handling arm. In some embodiments, a gas injection showerplate or an electrode with an array of gas injection holes in a processing chamber is above the wafer handling arm, and an FR in the processing chamber is below the wafer handling arm, as the wafer handling arm is moved into the processing chamber. Accordingly, a first camera sensor can be mounted on a top surface of the wafer handling arm and used for acquiring images of the array of the gas injection holes, and a second camera sensor can be mounted on a bottom surface of the wafer handling arm and used for acquiring images of the FR.

Figure 11:
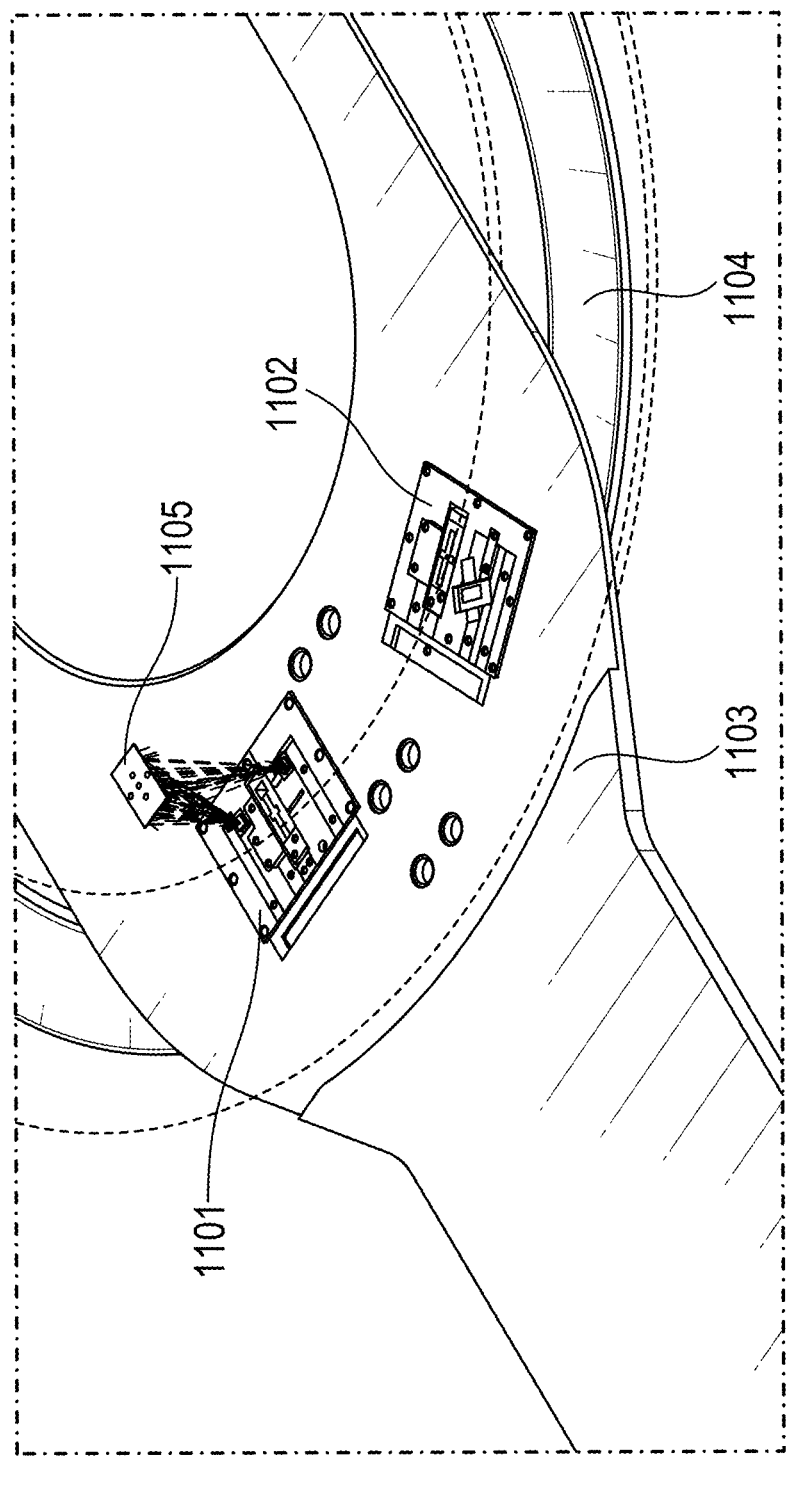
FIG. 11 shows an example of a mechanical model of a measurement setup according to an example embodiment of the disclosure.

FIG. 11 shows an example of a mechanical model of a measurement setup 1100 according to an embodiment of the disclosure. In the measurement setup 1100, two sensor assemblies 1101 and 1102 are mounted on a wafer handling arm 1103. An FR 1104 is below the wafer handling arm 1103, and a gas injection showerplate 1105 is above the wafer handling arm 1103. The sensor assembly 1101 is mounted on a top surface of the wafer handling arm 1103 and used for acquiring images of gas injection holes of the gas injection showerplate 1105. The sensor assembly 1102 is mounted on a bottom surface of the wafer handling 1103 and used for acquiring images of the FR 1104. Each sensor assembly includes a camera sensor and can optionally include at least one of a structured illuminator and a diffuse illuminator as shown in an embodiment.

Figure 12:
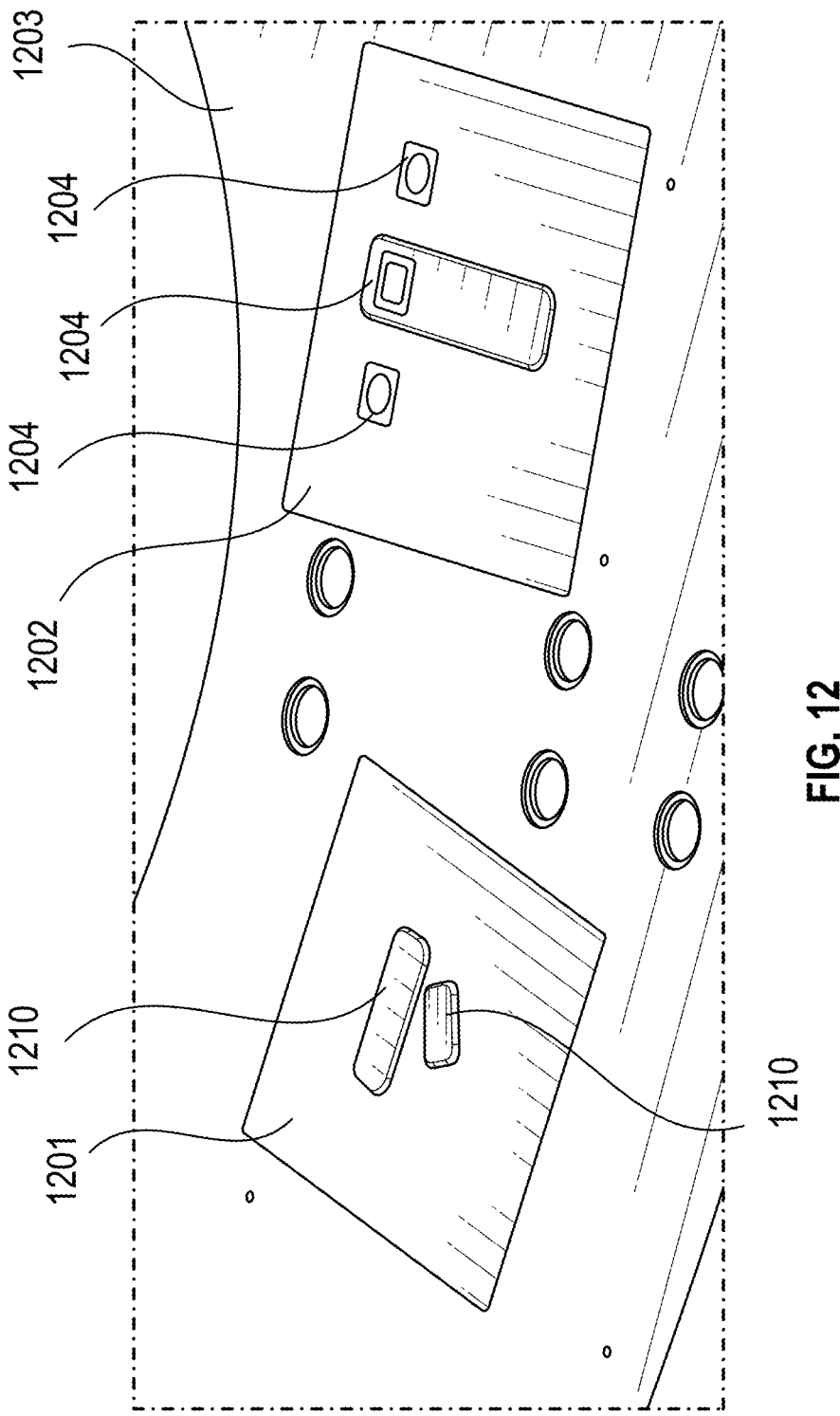
FIG. 12 shows a close up view of a mechanical model of a measurement setup according to an example embodiment of the disclosure.

FIG. 12 shows a close up view of a mechanical model of a measurement setup 1200 according to an embodiment of the disclosure. In the measurement setup 1200, two sensor assemblies 1201 and 1202 are mounted on a wafer handling arm 1203. Both camera sensors are encapsulated with protective enclosures and equipped with windows for providing optical access for imaging sensors (and structured and/or diffuse illuminators in some embodiments). The enclosures can be formed of stainless steel or other materials to provide a protection from erosion, chemical attack, and the like, and to facilitate easy maintenance and sensor replacement. The windows can be made of transparent materials, such as various kinds of glass, quartz, silica, and the like. In an embodiment, the sensor 1201 is used for acquiring images of an FR that is below the wafer handling arm 1203, so that enclosures 1210 are visible but windows of the system 1201 face a bottom surface of the wafer handling arm 1203. The sensor assembly 1202 is used for acquiring images of gas injection holes of a gas injection showerplate that is above the wafer handling arm 1203, so that windows 1204 face a top surface of the wafer handling arm 1203.

According to aspects of the disclosure, various ways of using the measurement setups presented in this disclosure are envisioned, including diagnosing a focus ring during actual wafer load and unload. Gas injection holes can be diagnosed by operating a wafer handling arm without a wafer present, e.g., between wafer processing.

One benefit of the camera (or optical) sensors described in this disclosure is that the sensors are located in places where the sensors are not exposed to a harsh chamber interior environment for at least most of the measurement time. Furthermore, the sensors can be miniaturized for mounting on a wafer handling arm, for example on an end effector of the wafer handling arm.

In some embodiments, in order to obtain additional information about the chamber components, a polarization filter can be used together with a camera sensor or other optical sensor. The polarization filter can obtain information about polarization, multi-wavelength illuminators, multispectral sensors, and edge-contrast enhancing techniques (ECETs). Examples of ECET methods include dark-field illumination, where no directly-reflected light is admitted to the camera sensor; phase contrast; and differential interference contrast (Nomarski interference contrast) methods.

FIG. 13 shows a flowchart outlining a process for manufacturing semiconductor devices according to an embodiment of the disclosure. The process 1300 can be executed by processing circuitry of an apparatus for diagnosing at least one consumable component in a processing chamber of a semiconductor processing system. The apparatus can be the semiconductor processing system described above. The process 1300 can be implemented in software instructions, and when the processing circuitry executes the software instructions, the processing circuitry performs the process 1300.

The process begins at step 1310 with repeatedly performing a transfer operation which transfers each of a plurality of semiconductor wafers between a substrate handling module and a processing chamber having at least one consumable component. For example, the substrate handling module can exchange processed and unprocessed wafers through a wafer access port in a system such as those described in FIGS. 1 and 2 above. In some embodiments, step 1310 can include transferring, via a wafer handling arm of a wafer handling robot in a wafer handling module of the semiconductor processing system, a wafer between the wafer handling module and a processing chamber of the semiconductor processing system. The wafer handling module is located proximate the processing chamber.

In step 1320 the processing chamber is used to perform a semiconductor manufacturing process on each of the plurality of semiconductor wafers. In some embodiments, the process is a plasma etch process which erodes the at least one consumable component of the process chamber.

In step 1330, an optical signal is detected from the at least one consumable component during a time when the processing chamber is not performing the semiconductor manufacturing process on the wafers. The optical signal can be detected from at least one of a focus ring, a gas injection showerplate, an electrode, a deposition shield, a processing chamber wall, a pumping baffle, a wafer chuck, and a wafer chuck shoulder, as discussed above. In some embodiments, step 1330 is performed only when the processing chamber is not performing the semiconductor manufacturing process on the wafers. For example, step 1330 may be performed only when a chamber access port of the processing chamber is open, such as when a robot arm is exchanging wafers in the processing chamber.

The process 1300 may be performed using any of the optical sensors, measurement setups or other devices and arrangements described herein. In some embodiments, the process can further include modifying the semiconductor manufacturing process based on the detected optical signal. For example, at least one process parameter can be modified to compensate for a wear state of the consumable component. In some embodiments, at least one process parameter can be modified to improve uniform processing across a semiconductor wafer.

The process 1300 may further include modifying the semiconductor chamber based on the detected optical signal. For example, a height of a focus ring may be adjusted based on the detected optical signal, or a focus ring may be replaced based on the detected optical signal.

In some embodiments, an algorithm may reconstruct a 3D profile of the FR as part of step 1320. As discussed above, the characteristic sample such as an axially symmetric focus ring (FR) is characterized by series of approximately horizontal (within the camera FOV) edges. In one example embodiment, both diffuse light and structured light images of the FR are captured by a camera. The diffuse and structured images may be obtained independent of each other and/or simultaneously. The diffuse light illuminated image of the FR is used to detect horizontal edges of the FR and determine their vertical coordinates in the camera FOV. Off-axis-line illuminated images of the FR are analyzed to find points where a projected line intersects horizontal edges detected from the diffuse light images. Based on horizontal coordinates of intersection points and known geometry of illuminator position with respect to the camera, distances from camera to corresponding horizontal edges of the FR can be determined. Vertical and depth information about horizontal edges is combined to reconstruct the FR radial profile, and thickness of the FR is calculated as well as any other relevant geometric parameters of the FR that are of interest. Thickness of the FR along with any other parameters of interest to adjust processing chamber operating parameters such as vertical position of the focus ring within the processing chamber.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" or "wafer" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the present disclosure are not intended to be limiting. Rather, any limitations to embodiments of the present disclosure are presented in the following claims.

What is claimed is:

1. A method of manufacturing semiconductor devices, comprising:

repeatedly performing a transfer operation which transfers each of a plurality of semiconductor wafers between a wafer handling module and a processing chamber through a wafer access port, the processing chamber comprising at least one consumable component;

performing, using the processing chamber, a semiconductor manufacturing process on each of the plurality of semiconductor wafers; and detecting an optical signal from the at least one consumable component during a time when the processing chamber is not performing the semiconductor manufacturing process on the wafers, wherein the detecting the optical signal includes acquiring a diffuse light image and a structured light image of one of the at least one consumable component, using the diffuse light image to detect edges of the one of the at least one consumable component, using the structured light image to identify intersecting points where structured light intersects the edges detected from the diffuse light image, and constructing a three-dimensional profile of the one of the at least one consumable component based on the intersecting points.

2. The method of claim 1, further comprising determining at least one property of the at least one consumable component from the optical signal.

3. The method of claim 1, wherein the detecting the optical signal comprises detecting the optical signal from at least one of a focus ring, a gas injection showerplate, an electrode, a deposition shield, a processing chamber wall, a pumping baffle, a wafer chuck, or a wafer chuck shoulder.

4. The method of claim 1, wherein the detecting the optical signal comprises detecting the optical signal from outside the processing chamber through the wafer access port when the wafer access port is open for wafer transfer.

5. The method of claim 1, wherein the detecting the optical signal further comprises:

providing an optical sensor on an inside wall of the wafer handling module in a location with visibility to the at least one consumable component, via the wafer access port, when the wafer access port is open for wafer transfer; and using the optical sensor to detect the optical signal.

6. The method of claim 1, wherein the detecting the optical signal further comprises:

providing an optical sensor on a wafer handling arm of a wafer transfer robot in a location with visibility to the at least one consumable component during wafer transfer; and using the optical sensor to detect the optical signal.

7. The method of claim 6, wherein the providing the optical sensor comprises providing the optical sensor on an end effector or a wafer platen of the wafer handling arm.

8. The method of claim 1, wherein the detecting the optical signal comprises using a camera for acquiring images of the at least one consumable component.

9. The method of claim 8, wherein the detecting the optical signal further comprises using a structured illuminator to illuminate the at least one consumable component during acquiring the images of the at least one consumable component.

10. The method of claim 9, wherein the using the structured illuminator comprises projecting an illumination pattern onto the at least one consumable component by sending an illumination beam at an angle to line-of-view of the camera.

11. The method of claim 10, further comprising determining at least one property of the at least one consumable component from the acquired images of the illumination pattern projected upon the at least one consumable component, wherein the at least one property of the at least one consumable component includes at least one dimension of the three-dimensional profile of the one of the at least one consumable component.

12. The method of claim 1, wherein the at least one consumable component is a focus ring, the method further comprises determining at least one of a thickness of the focus ring or a dimension of an edge profile of the focus ring.

13. The method of claim 1, wherein the at least one consumable component comprises an array of gas injection holes, the method further comprises determining at least one of a gas injection hole diameter or a dimension of a profile of a gas injection hole chamfer.

14. The method of claim 10, wherein the illumination pattern comprises a pattern of dots projected upon the at least one consumable component.

15. The method of claim 10, wherein the illumination pattern comprises at least one line projected upon the at least one consumable component.

16. The method of claim 8, further comprising illuminating the at least one consumable component with diffuse light during acquiring the images of the at least one consumable component.

17. The method of claim 1, wherein the detecting the optical signal comprises detecting the optical signal only during the time when the processing chamber is not performing the semiconductor manufacturing process on the wafers.

18. The method of claim 1, wherein the detecting the optical signal comprises detecting the optical signal only when the wafer access port is open.

19. The method of claim 1, further comprising modifying the semiconductor manufacturing process based on the detected optical signal.

20. The method of claim 19, wherein the modifying the semiconductor manufacturing process comprises modifying at least one process parameter to compensate for a wear state of the consumable component.

21. The method of claim 20, wherein the modifying the at least one process parameter comprises modifying the at least one process parameter to improve uniform process results across a wafer.

22. The method of claim 1, further comprising modifying the processing chamber based on the detected optical signal.

23. The method of claim 22, wherein the modifying the processing chamber comprises adjusting a height of a focus ring based on the detected optical signal.

24. The method of claim 22, wherein the modifying the processing chamber comprises replacing at least one of the consumable components based on the detected optical signal.

25. A method of detecting a state of a consumable component in a semiconductor processing chamber, the method comprising:

directing a diffuse light source and a structured light source to provide diffuse light and structured light incident on the consumable component;

acquiring at least one diffuse light image of the consumable component and at least one structured light image of the consumable component;

using the at least one diffuse light image to detect edges of the consumable component;

using the at least one structured light image to identify intersecting points where the structured light intersects the edges detected from the diffuse light image;

determining coordinates of the intersecting points within the semiconductor processing chamber; and constructing a 3D profile of the consumable component based on the coordinates of the intersection points.

* * * * *